United States Patent [19]

Flenniken

[11] Patent Number: 5,556,697
[45] Date of Patent: Sep. 17, 1996

[54] SEMICONDUCTIVE POWER CABLE SHIELD

[75] Inventor: Cindy L. Flenniken, Indianapolis, Ind.

[73] Assignee: BICC Cables Corporation, Indianapolis, Ind.

[21] Appl. No.: 217,116

[22] Filed: Mar. 24, 1994

[51] Int. Cl.$^6$ ............................ B32B 5/16; C08K 3/04
[52] U.S. Cl. ................ 428/323; 428/367; 428/372; 428/378; 428/379; 428/380; 428/391; 428/461; 428/462; 428/500; 428/521; 428/523; 524/495; 524/496; 174/105 SC; 174/120 SC; 174/120 SR; 252/511; 427/118
[58] Field of Search ........................ 428/323, 372, 428/378, 379, 380, 391, 461, 462, 500, 521, 367, 523; 524/495, 496; 174/105 SC, 120 SC, 120 SR; 252/511; 427/118

[56] References Cited

U.S. PATENT DOCUMENTS

| | | | |
|---|---|---|---|
| 4,212,756 | 7/1980 | Ashcraft et al. | 252/63.2 |
| 4,305,849 | 12/1981 | Kawasaki et al. | 252/567 |
| 4,376,180 | 3/1983 | Turbett et al. | 524/188 |
| 4,440,671 | 4/1984 | Turbett | 252/573 |
| 4,452,937 | 6/1984 | Keough | 524/398 |
| 4,612,139 | 9/1986 | Kawasaki et al. | 252/511 |
| 4,806,594 | 2/1989 | Gross et al. | 525/64 |
| 4,857,232 | 8/1989 | Burns, Jr. | 252/511 |
| 5,246,783 | 9/1993 | Spenadel et al. | 428/461 |
| 5,352,289 | 10/1994 | Weaver et al. | 106/476 |

FOREIGN PATENT DOCUMENTS

| | | |
|---|---|---|
| 662658 | 5/1963 | Canada . |
| 0420271 | 4/1991 | European Pat. Off. . |
| 53-21247 | 2/1978 | Japan . |
| 3255143 | 11/1991 | Japan . |
| 4216840 | 8/1992 | Japan . |
| WO93/08221 | 4/1993 | WIPO . |

OTHER PUBLICATIONS

English language translation of JP 3255143, Nov. 1991.
English language translation of JP 4216840, Aug. 1992.

Primary Examiner—Patrick Ryan
Assistant Examiner—Marie R. Yamnitsky
Attorney, Agent, or Firm—Oliff & Berridge

[57] ABSTRACT

Vulcanizable semiconductive shield compositions contain a linear, single-site catalyzed polymer formed by polymerizing ethylene with at least one comonomer selected from $C_3$ to $C_{20}$ alpha-olefins; a carbon black selected from furnace carbon blacks that contain ash and sulfur in amounts of 50 ppm or less and have crystal dimensions $L_a$ and $L_c$ of 30 Å or less, acetylene carbon blacks, and furnace carbon blacks having an ASTM grade of N-351; and a crosslinking agent. The compositions may be used to manufacture semiconductive shields for electrical conductors, such as power cables. The semiconductive shields exhibit improved processability, low water vapor transmission and low shrinkback, without abrading or corroding extrusion equipment.

17 Claims, No Drawings

SEMICONDUCTIVE POWER CABLE SHIELD

BACKGROUND OF THE INVENTION

The invention relates to semiconductive shields for use in electrical conductors such as power cables, and particularly to a vulcanizable semiconductive conductor or bonded insulation shield composition that exhibits improved physical properties and processability compared to known semiconductive conductor and bonded insulation shields.

Power cables typically include a core electrical conductor, an overlaying semiconductive shield (also called a "conductor screen"), an insulation layer formed over the semiconductive shield, and an outermost insulation shield (or screen). The semiconductive shield used to screen the electrical conductor is conventionally formed by dispersing various furnace-type carbon blacks, such as ASTM N-472 or P-type grades, in an ethylene copolymer resin base. These furnace blacks often have poor dispersion characteristics in polymers and contribute high levels of ionic contaminants. Consequently, protrusions and contaminants occur at the cable's shield/dielectric interface, causing increased stress gradients in an electrical field. This electrical field enhancement, combined with the migration of water and ions into the insulation, may lead to the formation of water trees and subsequent dielectric breakdown and premature cable failure.

Other commercially available high performance semiconductive shield compositions contain other types of carbon blacks, such as acetylene blacks, and an ethylene/ethylacrylate copolymer, ethylene/vinylacetate copolymer, ethylene/butylacrylate copolymer or blends of these materials with polyethylene. These materials typically contain reduced levels of ionic contamination and exhibit good dispersion and very smooth extrusion surfaces. Such shield compositions have a high viscosity due to the high carbon black loadings needed to achieve adequate conductivities and, therefore, abrade and/or corrode cable extrusion equipment. This wear results in poor extrusion cable surfaces and interfaces, thus reducing the shield's electrical performance properties.

Semiconductive shield compositions containing acetylene black and an ethylene/ethylacrylate copolymer often demonstrate "shrinkback" on the cable. Shrinkback occurs when the semiconductive shield anneals and shrinks following cable manufacture. Shrinkback causes the semiconductive shield to lose its adhesion to the conductor. As a result, the conductor protrudes out of the cable core, thus diminishing the integrity of the cable system, particularly at splices.

Efforts have been made to improve semiconductive shield compositions. High performance semiconductive conductor shield compositions that include an ethylene/vinyl acetate copolymer, acetylene carbon black, and an organic peroxide crosslinking agent are often used for these applications. Vinyl acetate resins, however, may only be used with aluminum conductors because they are corrosive to copper conductors. Furthermore, high loadings of acetylene black combined with ethylene/vinyl acetate resin lead to the formation of acids in the extruder which then corrode and abrade extrusion die tooling, resulting in cable dimension variations over time.

SUMMARY OF THE INVENTION

The invention is based on the discovery that improved semiconductor shields may be formed by dispersing certain selected carbon blacks in a linear, single-site catalyzed ethylene polymer. Thus, the invention provides a vulcanizable semiconductive shield composition, comprising: (a) a linear, single-site catalyzed polymer comprising ethylene polymerized with at least one comonomer selected from the group consisting of $C_3$ to $C_{20}$ alpha-olefins, (b) a carbon black selected from the group consisting of a furnace carbon black that contains ash in an amount of 50 ppm or less, sulfur in an amount of 50 ppm or less, and has crystal dimensions $L_a$ and $L_c$ of 30 Å or less, an acetylene carbon black, and a furnace carbon black having an ASTM grade of N-351, and (c) a crosslinking agent.

Semiconductive shields made of these compositions have significantly improved physical properties, such as low shrinkback, low water vapor transmission and smooth interfaces, as well as better processability compared to known semiconductive shields. In addition, the semiconductive shield compositions do not abrade or corrode extrusion equipment.

DETAILED DESCRIPTION OF PREFERRED EMBODIMENTS

The invention provides a vulcanizable semiconductive shield composition, comprising: (a) a linear, single-site catalyzed polymer comprising ethylene polymerized with at least one comonomer selected from the group consisting of $C_3$ to $C_{20}$ alpha-olefins, (b) a carbon black selected from the group consisting of a furnace carbon black that contains ash in an amount of 50 ppm or less, sulfur in an amount of 50 ppm or less, and has crystal dimensions $L_a$ and $L_c$ of 30 Å or less, an acetylene carbon black, and a furnace carbon black having an ASTM grade of N-351, and (c) a crosslinking agent.

Compared to known "supersmooth, extra clean" (high performance) shield compositions typically based on acetylene carbon blacks, the above semiconductive shield composition has been found to provide equivalent dispersion and smoothness at the shield/insulation interface, and enhanced physical, electrical and processing properties.

Useful linear, single-site (also called metallocene) catalyzed ethylene polymers are disclosed in U.S. Pat. No. 5,246,783, the entire disclosure of which is incorporated herein by reference. The preferred polymers are linear, single-site catalyzed polymers comprising ethylene polymerized with at least one comonomer selected from $C_3$ to $C_{20}$ alpha-olefins. Linear, single-site catalyzed polymers are commercially available and require no special modification to be useful in practicing the invention.

Examples of useful polymers include linear, single-site catalyzed ethylene/butene-1 copolymers, ethylene/propylene copolymers, ethylene/hexene-1 copolymers, ethylene/octene-1 copolymers, ethylene/propylene/1,4-hexadiene terpolymers, and ethylene/butene-1/1,4-hexadiene terpolymers. Ethylene/butene copolymers, ethylene/propylene copolymers, ethylene/octene copolymers, and ethylene/hexene copolymers are most preferred. The higher alpha-olefins tend to provide improved physical properties.

The linear, single-site catalyzed polymer preferably has a density of about 0.9 g/cm$^3$, although polymers having a broad range of densities may be used depending on cost restraints. The polymer preferably has a weight average molecular weight of from about 30,000 to about 70,000. Most preferably, the polymer has a weight average molecular weight of about 42,500, a number average molecular weight of about 20,000, and a Z average molecular weight of about 66,700. The polymer preferably has a polydispersity of from about 1.8 to about 2.5, most preferably about 2.15.

The linear, single-site catalyzed polymer's narrow molecular weight distribution (polydispersity) and narrow composition distribution contribute to the unique performance of the resin base when combined with specific carbon blacks. "Composition distribution" refers to the distribution of comonomer between polymer molecules, and is directly related to crystallizability, hexane extractability, toughness, and filler acceptance. The selected single-site catalyzed resins have a narrow compositional distribution, i.e., all the polymer molecules (chains) tend to have the same comonomer content throughout the entire resin sample regardless of the molecular weight of the chain.

Conventional Ziegler-Natta catalysts used for polyolefins contain many reactive sites on their surfaces; reactivity levels vary from site to site, causing variations in the polymers produced. Single-site catalysts also have many sites, but the sites are identical. This allows resins to be made which maximize desired physical properties, like toughness, by closely replicating, in polymer after polymer, the same molecular arrangement and weight. The result is a resin that is narrower in molecular weight distribution (MWD) than conventional linear polyethylene.

The selected single-site catalyzed resins demonstrate the superior physical properties of typical linear low density polyethylene (LLDPE) homopolymer, as well as the enhanced processability characteristic of low density polyethylene (LDPE) copolymers.

The linear, single-site catalyzed polymer is preferably present in the semiconductive shield composition in an amount of from about 50 to about 70 weight percent of the total formulation. The shield's final composition depends on the amounts of other components added to the resin, described below.

Dozens of different types of carbon blacks are known, a few of which are described in the following table:

TABLE 1

| Carbon Black Type or Grade | ASTM [1] Particle Size, nm | Structure Pellet DBP (ml/100 g) | Surface Area | |
|---|---|---|---|---|
| | | | Iodine No. (mg/g) | $N_2$BET ($m^2$/g) |
| N-351 | 30 | 123 ± 5 | 68 ± 4 | 63 |
| New Oil CB [2] | 53 | 115 ± 5 | 40 ± 4 | 38 |
| Acetylene CB | 29–39 | 110–230 | 85–100 | 66–73 |
| N-472 | 30 | 174 ± 10 | 253 ± 20 | 245 |
| P-type CB | 20 | 116 ± 5 | 172 ± 10 | 148 |

[1] ASTM Average Particle Size is done using image analysis.
[2] "New Oil CB" refers to a carbon black having the following properties:

| | |
|---|---|
| Ash | ≦50 ppm |
| Sulfur | ≦50 ppm |
| DBP | 105–170 |
| Iodine No. | 36–44 |
| Crystalline Structure | |
| La | ≦30 Å |
| Lc | ≦30 Å |

The inventor discovered that, of the known types of carbon blacks, three kinds of carbon blacks provide semiconductive shields showing unexpectedly improved physical properties and processability when combined with a linear, single-site catalyzed ethylene polymer. These preferred carbon blacks are: (1) furnace carbon blacks that contain ash in an amount of 50 ppm or less, sulfur in an amount of 50 ppm or less, and have crystal dimensions $L_a$ and $L_c$ of 30 Å or less, (2) acetylene carbon blacks, and (3) furnace carbon blacks having an ASTM grade of N-351.

The above carbon blacks are commercially available, and require no special modification to carry out the invention. The carbon black is preferably present in the semiconductive shield in an amount of from about 30 to about 45 weight percent, based on the total weight of the semiconductive shield composition.

Furnace carbon blacks that contain ash in an amount of 50 ppm or less, sulfur in an amount of 50 ppm or less, and have crystal dimensions $L_a$ and $L_c$ of 30 Å or less are readily dispersible in the linear, single-site catalyzed polymer and provide an extremely smooth interface with a power cable's insulation layer. Due to its low surface area, this type of carbon black has a lower conductivity than typical furnace blacks such as P-type and N-472 ASTM grade blacks; however, it is also less reinforcing. Thus, a low viscosity shield composition having excellent physical properties may be provided, while dispersing a high level of carbon black in the resin. A high carbon black loading (from about 30 to 45 weight percent) is needed for the shield to exhibit adequate electrical conductivity.

Furnace carbon blacks having an ASTM grade of N-351, which contain conventional sulfur and ash levels, have also successfully been used according to the invention, although their cleanliness (low ionics) is not equivalent to the low sulfur/ash furnace black described above. Acetylene carbon blacks have also been found to provide unexpected improvements in physical properties and processability when combined with linear, single-site catalyzed polymers.

The semiconductive shield composition preferably includes at least one crosslinking agent, in an amount of from about 0.5 to about 5 weight percent based on 100 parts resin. An organic peroxide is preferably used as a free radical generator and crosslinking agent. Useful organic peroxide crosslinking agents include, but are not limited to, α, α'-bis-(tert-butylperoxy)-diisopropylbenzene, dicumyl peroxide, di(tertiarybutyl) peroxide, and 2,5-dimethyl-2,5-di(t-butylperoxy)-hexane.

Various other known coagents and crosslinking agents may be used.

Mixtures of antioxidants, processing aids and organic peroxide curatives may be used to prepare the final semiconductive shield composition. The semiconductive shield composition may include a variety of conventional additives. Antioxidants and processing aids, for example, conventionally used in cable conductor shield compositions may be used in the formulations. Polymerized 1,2-dihydro-2,2,4-trimethylquinoline or octadecyl 3,5-di-tert-butyl-4-hydroxyhydrocinnamate are preferred antioxidants, in amounts of from about 0.2 to about 2.0 weight percent, preferably from about 0.4 and to about 0.75 weight percent. Other suitable conventional antioxidants include sterically hindered phenols, phosphites, and selected amines.

Although processing aids are not necessary to achieve homogeneous blends and reduced viscosity, metal stearates or salts, polysiloxanes, and/or polyethylene glycols (molecular weights of from about 10,000 to about 30,000) may be incorporated into the products of the invention to further enhance these properties. Processing aids, when present, are generally used in amounts of from about 0.1 to about 5.0 weight percent, based on the total weight of the semiconductive shield composition.

The semiconductive shield composition may also include a crosslinkable ethylene vinyl-silane copolymer in an amount of from about 0.2 to about 20 weight percent, preferably from about 1 to about 5 weight percent, based on the total weight of the semiconductive shield composition.

The semiconductive shield composition may be manufactured using conventional machinery and methods known in the industry. The compositions may be prepared by batch or continuous mixing processes well known in the art. Equipment such as Banbury mixers, Buss co-kneaders, and twin screw extruders may be used to mix the ingredients of the formulation. For instance, the components of the semiconductive shield composition may be mixed and formed into pellets for future use in manufacturing insulated electrical conductors such as power cables.

The semiconductive shield composition may be incorporated into any product where its properties are suitable. The semiconductive shield composition is particularly useful for making insulated electrical conductors such as electrical wires and power cables. As described above, the semiconductive shield is conventionally formed directly over the inner electrical conductor as a conductor shield or over the insulation material as a bonded insulation shield.

Insulated electrical conductors containing the semiconductive shield may be manufactured using conventional equipment and known techniques, such as two-pass extrusion or single-pass true-triple extrusion. In a true-triple extrusion process, the semiconductive conductor shielding layer, insulation layer, and overlying semiconductive insulation shielding layer are extruded in a common extrusion head and cured (crosslinked) simultaneously in a single step.

Thus, the invention provides a true-triple extrusion method of manufacturing an insulated electrical conductor, comprising (a) extruding a vulcanizable semiconductive shield over an electrically conductive member (such as an aluminum or copper conductor), the vulcanizable semiconductive shield having a composition comprising (i) a linear, single-site catalyzed polymer comprising ethylene polymerized with at least one comonomer selected from the group consisting of $C_3$ to $C_{20}$ alpha-olefins, (ii) a carbon black selected from the group consisting of a furnace carbon black that contains ash in an amount of 50 ppm or less, sulfur in an amount of 50 ppm or less, and has crystal dimensions $L_a$ and $L_c$ of 30 Å or less, an acetylene carbon black, and a furnace carbon black having an ASTM grade of N-351, and (iii) a crosslinking agent; (b) extruding an insulation layer and an insulation shield over the vulcanizable semiconductive shield; and (c) curing the vulcanizable semiconductive shield, insulation layer, and insulation shield to form an insulated electrical conductor.

In a two-pass extrusion process (dual-tandem extrusion), the conductor shield and insulation are first extruded in tandem and crosslinked prior to extruding and crosslinking the semiconductive insulation shield layer. Alternatively, a tandem extrusion process may be carried out in which the conductor shield is first extruded, followed by extrusion of the insulation and insulation shield in a dual extrusion head.

A single-step (true-triple) extrusion method is preferred because it minimizes the number of manufacturing steps and contamination between the cable's layers. True-triple extrusion prevents dust from settling on the shield surface between the conductor shield and the insulation/insulation shield extruder heads.

Current industry standards limit protrusions from the conductor and insulation shield materials to 75 and 125 μm, respectively. Products incorporating the disclosed shield compositions may readily meet these standards. Semiconductive shields provided by the invention show better toughness, abrasion resistance, low temperature brittleness, low extractables and flexibility than conventional shields. Less deterioration of extrusion dies, tooling and barrels is observed using shield compositions according to the invention than typical using known cable shields. This is believed to be due to the chemical stability of the resin base (ethylene/butene copolymer is more stable than ethylene/vinyl acetate copolymer, for example) and the low viscosity (less abrasion to tooling) provided by the combination of a linear, single-site catalyzed polymer with one of the three carbon blacks described above.

In addition, the semiconductive shield composition demonstrates less shrinkback than conventional shields such as those containing ethylene/ethylacrylate copolymers and acetylene black.

The following examples are provided to illustrate the invention.

EXAMPLE 1

A semiconductive power cable conductor shield is formed by extruding a dispersion of a furnace carbon black that contains ash in an amount of 50 ppm or less, sulfur in an amount of 50 ppm or less, and has crystal dimensions $L_a$ and $L_c$ of 30 Å or less ("New Oil Furnace Carbon Black") in a linear, single-site catalyzed ethylene/butene copolymer. The composition used to form the cable shield is as follows:

| Component | Amount (Wt. %) |
| --- | --- |
| Ethylene/Butene Copolymer [1] | 58.0 |
| New Oil Furnace Carbon Black | 40.5 |
| Antioxidant | 0.5 |
| Processing Aid | 0 |
| Organic Peroxide Curative | 1.0 |
| TOTAL | 100.0 |

[1] 0.9 density/27 MI/15 wt % butene/2.15 MWD

The physical properties and processability of the cable shield are measured.

EXAMPLE 2

A semiconductive power cable shield is formed using the same materials and process described in Example 1, except that an acetylene carbon black is substituted for the New Oil Furnace Carbon Black. The composition used to form the cable shield is as follows:

| Component | Amount (Wt. %) |
| --- | --- |
| Ethylene/Butene Copolymer [1] | 57.5–63.5 |
| Acetylene Carbon Black | 35–41 |
| Antioxidant | 0.5 |
| Processing Aid | 0 |
| Organic Peroxide Curative | 1.0 |
| TOTAL | 100.0 |

[1] 0.9 density/27 MI/15 wt % butene/2.15 MWD

The physical properties and processability of the cable shield are measured.

EXAMPLE 3

A semiconductive power cable shield is formed using the same materials and process described in Example 1, except that an N-351 ASTM grade furnace carbon black is substituted for the New Oil Furnace Carbon Black. The physical properties and processability of the cable shield are measured.

EXAMPLE 4

A semiconductive power cable shield is formed using the same materials and process described in Example 1, except that a crosslinkable ethylene vinyl-silane copolymer is also added to the semiconductive composition. The composition used to form the cable shield is as follows:

| Component | Amount (Wt. %) |
| --- | --- |
| Ethylene/Butene Copolymer [1] | 56.77 |
| Silane Copolymer | 1.25 |
| Carbon Black [2] | 40.50 |
| Antioxidant | 0.50 |
| Processing Aid | 0 |
| Organic Peroxide Curative | 0.98 |
| TOTAL | 100.00 |

[1] 0.9 density/27 MI/15 wt % butene/2.15 MWD
[2] Carbon Black is one of the following: (1) New Oil Furnace Carbon Black; (2) N-351 ASTM grade furnace carbon black; or (3) acetylene carbon black.

The physical properties and processability of the cable shield are measured.

COMPARATIVE EXAMPLE 1

A commercially available semiconductive power cable shield, having a composition based on ethylene/ethylacrylate copolymer and acetylene black, is provided. The physical properties and processability of the comparative cable shield are measured and compared to the cable shields prepared according to Examples 1–4.

COMPARATIVE EXAMPLE 2

A commercially available semiconductive power cable shield, having a composition based on an ethylene/vinylacetate copolymer and acetylene black, is provided. The physical properties and processability of the comparative cable shield are measured and compared to the cable shields prepared according to Examples 1–4.

The results are summarized in Tables 2–3 below:

TABLE 2

| Physical Properties/Processability | Example 1 | Example 2 | Example 3 | Example 4 |
| --- | --- | --- | --- | --- |
| Smoothness [1] | Smooth | Smooth | Smooth | Smooth |
| Cleanliness | Clean | Clean | Clean | Clean |
| (sulfur, ppm) | <50 | <50 | 50–5000 | 50–5000 |
| Compatibility with Strandfill | Excellent | Excellent | Best | Not measured |
| Adhesive Bonding to Copper Conductor | None | None | None | Not measured |
| Shrinkback | Good | Good | Good | Best |
| Head Pressure | Low | Low–Medium | Medium | Medium |
| Low Molec. Wt % [2] | Least | Least | Least | Least |
| Water Vapor [3] Transmission | Medium | Low | Medium | Not measured |
| Die/Tooling Wear | Low | Low | Low | Low |
| Mar Resistance | Good | Good | Good | Good |

[1] As measured by Image Analysis and Laser Scanner Devices.
[2] As indicated by Molecular Weight Distribution.
[3] As measured by ASTM E-96 Water Vapor Transmission at 50° C.

TABLE 3

| Physical Properties/Processability | Compar. Ex. 1 | Compar. Ex. 2 |
| --- | --- | --- |
| Smoothness [1] | Smooth | Smooth |
| Cleanliness | Clean | Clean |
| (sulfur, ppm) | <50 | <50 |
| Compatibility with Strandfill | Variable | Variable |
| Adhesive Bonding to Copper Conductor | Some | Excessive |
| Shrinkback | Poor | Good |
| Head Pressure | High | High |
| Low Molec. Wt % [2] | More | More |
| Water Vapor [3] Transmission | Medium | High |
| Die/Tooling Wear | High | Highest |
| Mar Resistance | Poor | Poor |

[1] As measured by Image Analysis and Laser Scanner Devices.
[2] As indicated by Molecular Weight Distribution.
[3] As measured by ASTM E-96 Water Vapor Transmission at 50° C.

These data illustrate that the combination of a linear, single-site catalyzed polymer with one of the selected carbon blacks provides substantial improvements in physical properties and processability over commercially available power cable shields. The cable shields of the invention demonstrate low to medium water vapor transmission, low shrinkback, and good compatibility with both copper and aluminum conductors. The cable shields do not corrode or abrade extrusion equipment, as commonly observed with shields using ethylene/vinylester copolymers.

The foregoing embodiments are intended to illustrate and not limit the invention. It will be apparent that various modifications can be made without departing from the spirit and scope of the invention as defined by the appended claims.

What is claimed is:

1. A vulcanizable semiconductive shield composition, comprising: (a) a linear, single-site catalyzed polymer comprising ethylene polymerized with at least one comonomer selected from the group consisting of $C_3$ to $C_{20}$ alpha-olefins, (b) a carbon black selected from the group consisting of a furnace carbon black that contains ash in an amount of 50 ppm or less, sulfur in an amount of 50 ppm or less, and has crystal dimensions $L_a$ and $L_c$ of 30 Å or less, and a furnace carbon black having an ASTM grade of N-351, and (c) a crosslinking agent.

2. The vulcanizable semiconductive shield composition of claim 1, wherein the carbon black is a furnace carbon black that contains ash in an amount of 50 ppm or less, sulfur in an amount of 50 ppm or less, and has crystal dimensions $L_a$ and $L_c$ of 30 Å or less.

3. The vulcanizable semiconductive shield composition of claim 1, wherein the carbon black is a furnace carbon black having an ASTM grade of N-351.

4. The vulcanizable semiconductive shield composition of claim 1, wherein the carbon black is present in an amount of from about 30 to about 45 weight percent, based on the total weight of the semiconductive shield composition.

5. The vulcanizable semiconductive shield composition of claim 1, wherein the linear, single-site catalyzed polymer is polymerized using a metallocene catalyst system.

6. The vulcanizable semiconductive shield composition of claim 1, wherein the linear, single-site catalyzed polymer is selected from the group consisting of ethylene/butene-1 copolymers, ethylene/propylene copolymers, ethylene/hexene-1 copolymers, ethylene/octene-1 copolymers, ethylene/propylene/1,4-hexadiene terpolymers, and ethylene/butene-1/1, 4-hexadiene terpolymers.

7. The vulcanizable semiconductive shield composition of claim 1, wherein the linear, single-site catalyzed polymer has a weight average molecular weight of from about 30,000 to about 70,000.

8. The vulcanizable semiconductive shield composition of claim 1, wherein the linear, single-site catalyzed polymer has a polydispersity of from about 1.8 to about 2.5.

9. The vulcanizable semiconductive shield composition of claim 1, wherein the linear, single-site catalyzed polymer has a polydispersity of about 2.15.

10. The vulcanizable semiconductive shield composition of claim 1, wherein the linear, single-site catalyzed polymer is present in an amount of from about 50 to about 70 weight percent, based on the total weight of the semiconductive shield composition.

11. The vulcanizable semiconductive shield composition of claim 1, wherein the crosslinking agent is an organic peroxide crosslinking agent, present in an amount of from about 0.5 to about 5 weight percent, based on the total weight of the linear, single-site catalyzed polymer.

12. The vulcanizable semiconductive shield composition of claim 11, wherein the organic peroxide crosslinking agent is selected from the group consisting of α, α'-bis(tert-butylperoxy)-diisopropylbenzene, dicumyl peroxide, di(tertiarybutyl) peroxide, and 2,5-dimethyl- 2,5-di(t-butylperoxy)-hexane.

13. The vulcanizable semiconductive shield composition of claim 1, further comprising a crosslinkable ethylene vinyl-silane copolymer in an amount of from about 0.2 to about 20 weight percent, based on the total weight of the semiconductive shield composition.

14. The vulcanizable semiconductive shield composition of claim 1, further comprising from about 0.2 to about 2.0 weight percent, based on the total weight of the semiconductive shield composition, of an antioxidant selected from the group consisting of polymerized 1,2-dihydro-2,2,4-trimethylquinoline, and octadecyl 3,5-di-tert-butyl-4-hydroxyhydrocinnamate.

15. The vulcanizable semiconductive shield composition of claim 1, further comprising a processing aid selected from the group consisting of polyethylene glycols having an average molecular weight of from about 10,000 to about 30,000, metal stearates or salts thereof, polysiloxanes, and mixtures thereof.

16. An insulated electrical conductor, comprising an electrically conductive member and a vulcanizable semiconductive shield formed over the electrically conductive member, the vulcanizable semiconductive shield comprising (a) a linear, single-site catalyzed polymer comprising ethylene polymerized with at least one comonomer selected from the group consisting of $C_3$ to $C_{20}$ alpha-olefins, (b) a carbon black selected from the group consisting of a furnace carbon black that contains ash in an amount of 50 ppm or less, sulfur in an amount of 50 ppm or less, and has crystal dimensions $L_a$ and $L_c$ of 30 Å or less, and a furnace carbon black having an ASTM grade of N-351, and (c) a crosslinking agent.

17. A method of manufacturing an insulated electrical conductor, comprising:

(a) extruding a vulcanizable semiconductive shield over an electrically conductive member, the vulcanizable semiconductive shield having a composition comprising (i) a linear, single-site catalyzed polymer comprising ethylene polymerized with at least one comonomer selected from the group consisting of $C_3$ to $C_{20}$ alpha-olefins, (ii) a carbon black selected from the group consisting of a furnace carbon black that contains ash in an amount of 50 ppm or less, sulfur in an amount of 50 ppm or less, and has crystal dimensions $L_a$ and $L_c$ of 30 Å or less, and a furnace carbon black having an ASTM grade of N-351, and (iii) a crosslinking agent;

(b) extruding an insulation layer and an insulation shield over the vulcanizable semiconductive shield; and (c) curing the vulcanizable semiconductive shield, insulation layer, and insulation shield to form an insulated electrical conductor.

* * * * *